United States Patent
Lin

(10) Patent No.: US 8,749,301 B2
(45) Date of Patent: Jun. 10, 2014

(54) POWER MANAGEMENT DEVICE AND POWER MANAGEMENT METHOD OF TOUCHABLE CONTROL SYSTEM

(71) Applicant: Egalax_Empia Technology Inc., Taipei (TW)

(72) Inventor: Po-Chuan Lin, Taipei (TW)

(73) Assignee: Egalax_Empia Technology Inc., Taipei (TW)

( * ) Notice: Subject to any disclaimer, the term of this patent is extended or adjusted under 35 U.S.C. 154(b) by 0 days.

(21) Appl. No.: 13/739,521

(22) Filed: Jan. 11, 2013

(65) Prior Publication Data

US 2014/0103982 A1    Apr. 17, 2014

(30) Foreign Application Priority Data

Oct. 11, 2012  (TW) ............................ 101137549 A

(51) Int. Cl.
*G05F 1/10*   (2006.01)

(52) U.S. Cl.
USPC ......................................................... 327/536

(58) Field of Classification Search
USPC ........................................ 327/535, 536, 537
See application file for complete search history.

(56) References Cited

U.S. PATENT DOCUMENTS

| | | | | |
|---|---|---|---|---|
| 5,258,662 A * | 11/1993 | Skovmand | ..................... | 327/544 |
| 6,278,317 B1 * | 8/2001 | Hsu et al. | ....................... | 327/536 |
| 7,253,676 B2 * | 8/2007 | Fukuda et al. | ................ | 327/536 |
| 7,586,360 B2 * | 9/2009 | Jung | ............................... | 327/536 |
| 7,928,796 B2 * | 4/2011 | Namekawa | .................... | 327/537 |
| 8,120,412 B2 * | 2/2012 | Pelley | ............................ | 327/536 |

* cited by examiner

*Primary Examiner* — Jeffrey Zweizig
(74) *Attorney, Agent, or Firm* — Huffman Law Group, P.C.

(57) ABSTRACT

A power management device of a touchable control system includes a boost circuit boosting an output voltage according to an input voltage, a controlling signal for ballasting charging, and a controlling signal for boosting charging, a detection circuit detecting a predetermined value of the output voltage, a modulation circuit, and a loading circuit. The modulation circuit separately modulates the output voltage by the controlling signal for ballasting charging after the output voltage reaches the predetermined value and by the controlling signal for boosting charging before the output voltage reaches the predetermined value according to the detecting of the detection circuit. The loading circuit receives the reached predetermined value of the output voltage according to the modulation of the modulation circuit, wherein the controlling signal for boosting charging modulating the output voltage is more rapid than the controlling signal for ballasting charging modulating the output voltage.

25 Claims, 9 Drawing Sheets

—— the charging curve of CKH
------ the charging curve of CK

POWER MANAGEMENT DEVICE AND POWER MANAGEMENT METHOD OF TOUCHABLE CONTROL SYSTEM

BACKGROUND OF THE INVENTION

1. Field of the Invention

The present invention generally relates to a touchable control system, and more particularly to a power management device of a touchable control system for rapidly replying to a sleep mode.

2. Description of Related Art

A touch panel may be combined with a display screen to result in a touch screen. Touch screens have been widely used as input interfaces for electronic devices for detecting touch inputs within a display area. If no touch inputs input to the touch screen, users usually close the power supplied to the touch screen to enable the sleep mode for avoiding the unnecessary power consumption.

FIG. 1A shows a schematic circuit of a power management device 1 of a conventional touchable control system. As mentioned above, if the power of the touch screen is closed to enable the sleep mode, there are neither input signals of $V_{DD}$ and CK/CKB, nor output voltage $V_{out}$ and the loading circuit is disabled, wherein $V_{DD}$ is a logic high-level voltage (or the low voltage) of a pulse/inverted-pulse signal CK/CKB.

FIG. 1B shows an operating state of the power management device 1 of the conventional touchable control system. If the users need to use the touch panel to restore the sleep mode to the operating mode, the loading circuit has to reach the operating voltage $V_{DDH}$. In view of FIG. 1A, the loading circuit electrically connects to the output terminal 11t of the boost circuit 11 so as to consume the output current $I_O$. That is, the current consumption adds the loading current $I_{Load}$. The output voltage $V_{out}$ usually utilities an external capacitor $C_{ext}$ to charge as the operating voltage of the loading circuit. In other words, if the touchable control system needs to restore the sleep mode to the operating mode, the external capacitor $C_{ext}$ will start to charge. However, the output current Io do not fully flow to the external capacitor $C_{ext}$ but the loading circuit consumes a part of the output current Io, wherein the consuming output current $I_O$ is the loading current $I_{Load}$. Therefore, it takes much charge time to make the external capacitor $C_{ext}$ reach the operating voltage $V_{DDH}$ of the loading circuit. The operating state as the curve 1 shown, which charges the external capacitor $C_{ext}$ by a controlling signal for ballasting charging.

As mentioned above, the loading circuit of the touchable control system needs to reach the predetermined operating voltage $V_{DDH}$ so as to operate. However, the conventional designed touchable control system will charge the external capacitor $C_{ext}$ to the operating voltage $V_{DDH}$ by a controlling signal for ballasting charging while receiving touch inputs. Although the charging time may be only few microseconds, the charging rate of the controlling signal for ballasting charging is over slowly, which still make the users feel slow or delay with the conventional touchable control system.

A need has thus arisen to propose a novel power management device and a power management method for rapidly replying to the sleep mode of the conventional touchable control system.

SUMMARY OF THE INVENTION

In view of the foregoing, before the output voltage reaches the predetermined value, that is the operating voltage which the loading circuit can operate, the power management device and the power management method of the touchable control system of the present invention modulate the output voltage generated by the boost circuit by the controlling signal for boosting charging higher than the controlling signal for ballasting charging. Therefore, the output voltage more rapidly reaches the predetermined value so as to it can significantly decrease the response time of restoring the sleep mode to the operating mode by the touchable control system of the present invention such that the users can use such a mobile phone, a computer or an electronic system having a touchable screen of an electronic system more conveniently and rapidly. Besides, after the output voltage reaches the predetermined value, the power management device modulates the output voltage generated by the boost circuit by the controlling signal for ballasting charging so as to the output voltage steady rises. Therefore, the power management device avoids consuming the power and damaging the transistor and effectively manages the power of the touchable control system.

The power management device of the touchable control system includes a boost circuit, a detection circuit, a modulation circuit, and a loading circuit. The boost circuit boosts an output voltage according to an input voltage, a controlling signal for ballasting charging, and a controlling signal for boosting charging. The detection circuit detects a predetermined value of the output voltage. The modulation circuit separately modulates the output voltage by the controlling signal for ballasting charging after the output voltage reaches the predetermined value and by the controlling signal for boosting charging before the output voltage reaches the predetermined value according to the detecting of the detection circuit. The loading circuit receives the reached predetermined value of the output voltage according to the modulation of the modulation circuit, wherein the controlling signal for boosting charging modulating the output voltage is more rapider than the controlling signal for ballasting charging modulating the output voltage.

The power management method of a touchable control system, comprises the following steps: boosting an output voltage of a boost circuit according to an input voltage, a controlling signal for ballasting charging, and a controlling signal for boosting charging; detecting whether the output voltage reaches a predetermined value by a detection circuit; modulating the output voltage by the controlling signal for ballasting charging after the output voltage reaches the predetermined value and by the controlling signal for boosting charging before the output voltage reaches the predetermined value by the modulation circuit, wherein the controlling signal for boosting charging modulating the output voltage is more rapider than the controlling signal for ballasting charging modulating the output voltage; and receiving the reached predetermined value of the output voltage by a loading circuit.

DETAILED DESCRIPTION OF THE INVENTION

Figure 1A:
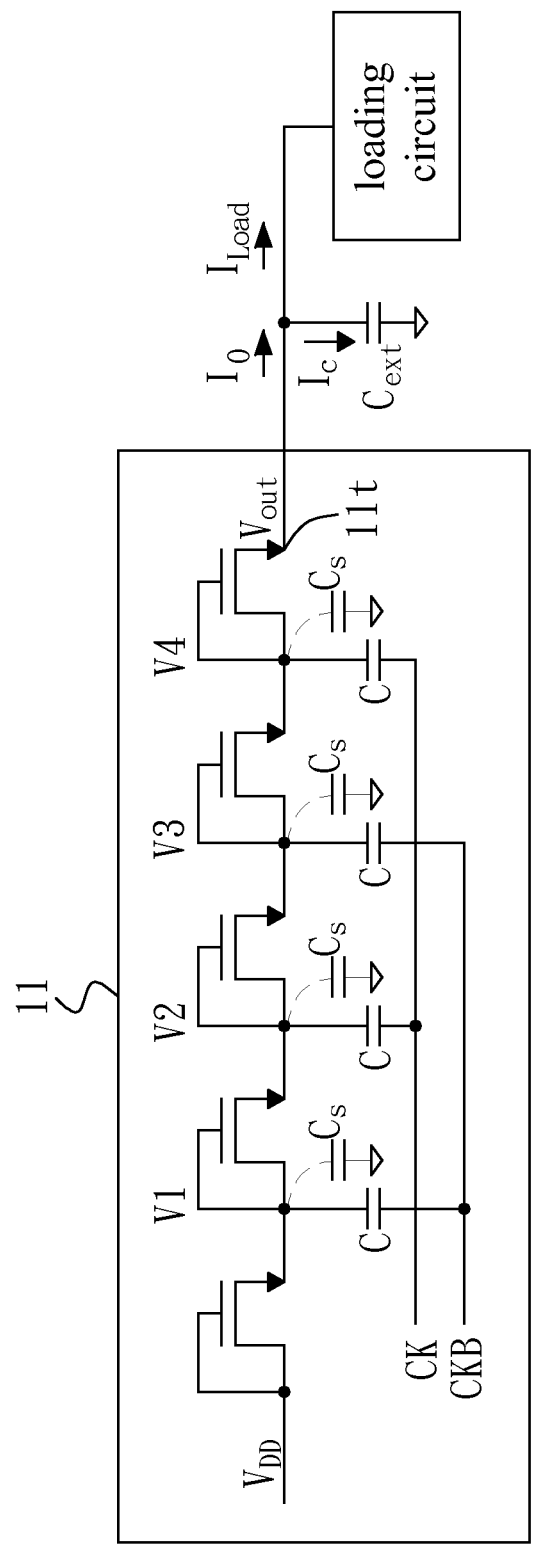
FIG. 1A shows a schematic circuit of a power management device of a conventional touchable control system.
Figure 1B:
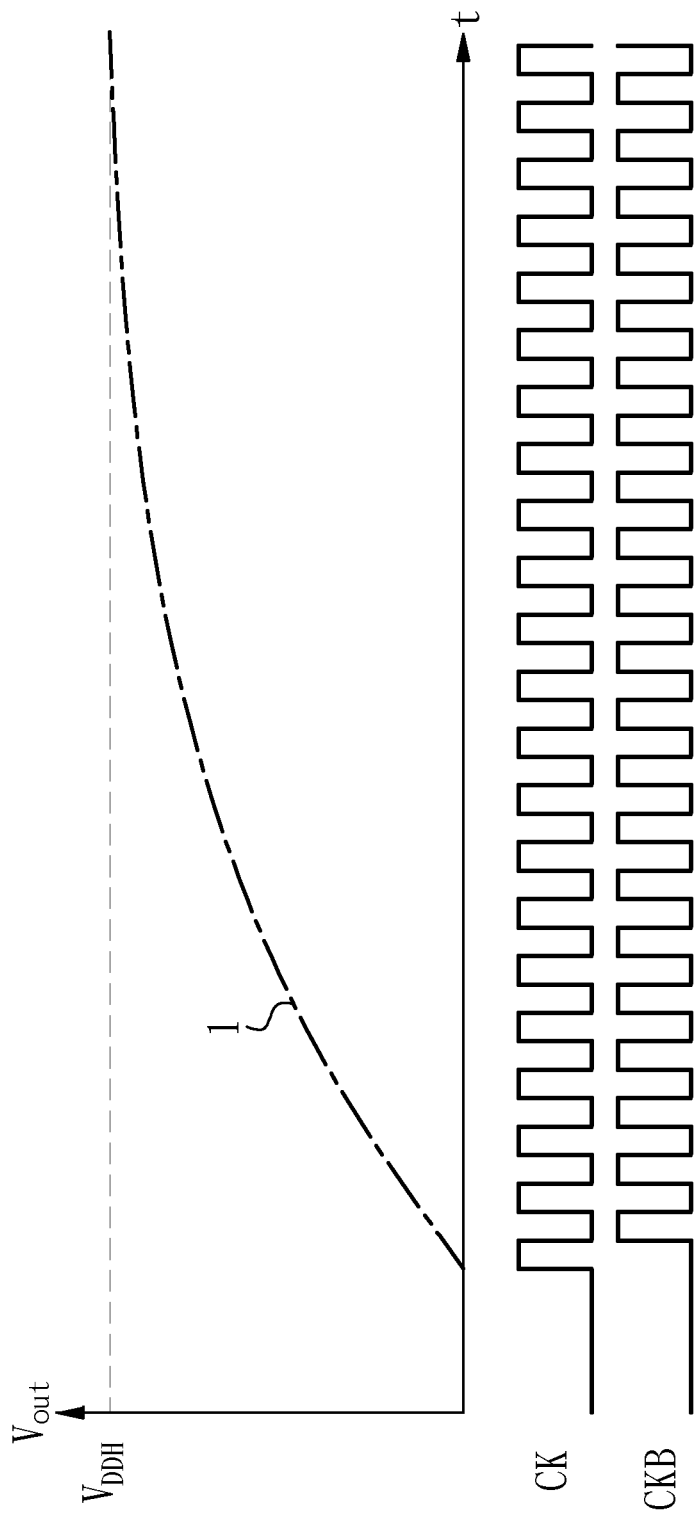
FIG. 1B shows an operating state of the power management device of the conventional touchable control system.
Figure 2A:
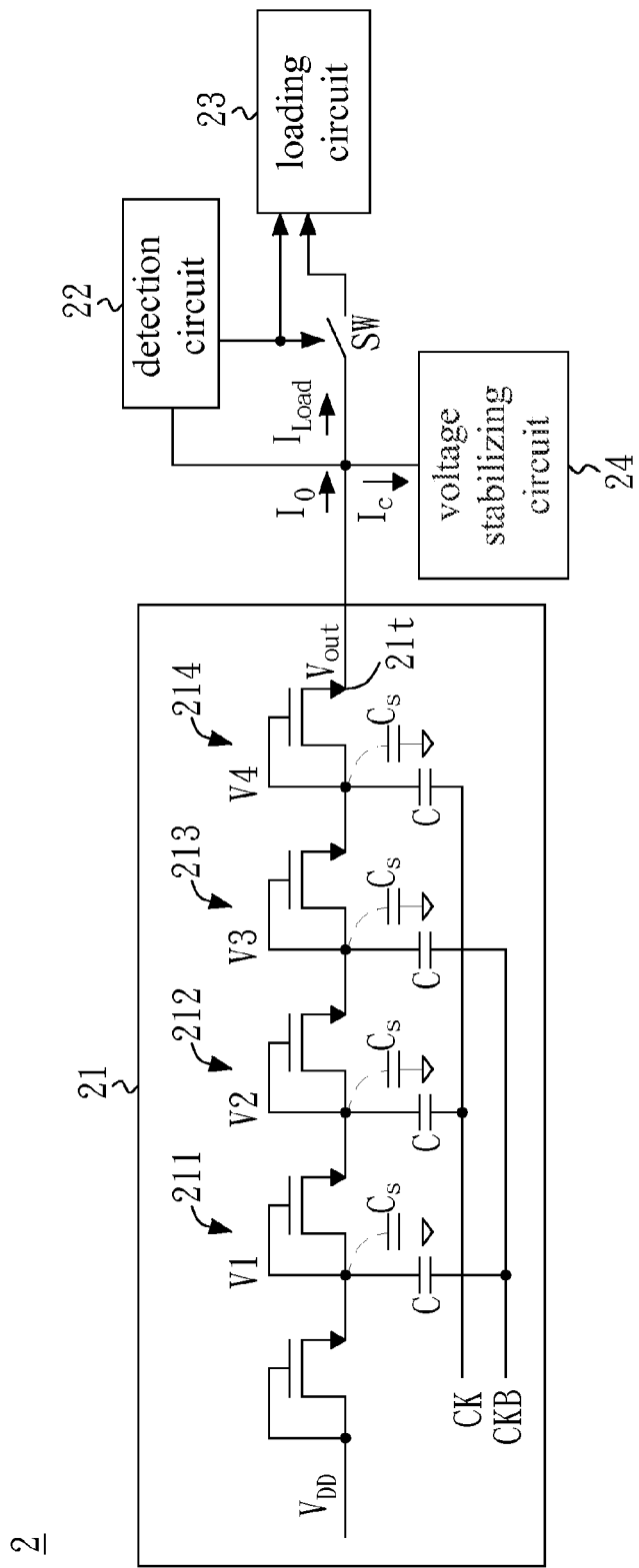
FIG. 2A shows the schematic circuit of the power management device of the touchable control system of the present invention.

FIG. 2A shows the schematic circuit of the power management device of the touchable control system of the present invention. The power management device 2 comprises a boost circuit 21, a detection circuit 22, a modulation circuit (not shown) and a loading circuit 23. The boost circuit 21 boosts an output voltage according to an input voltage, a controlling signal for ballasting charging, and a controlling signal for boosting charging. The detection circuit 22 detects a predetermined value of the output voltage. The modulation circuit separately modulates the output voltage by the controlling signal for ballasting charging after the output voltage reaches the predetermined value and by the controlling signal for boosting charging before the output voltage reaches the predetermined value according to the detecting of the detection circuit, wherein the controlling signal for boosting charging modulating the output voltage is more rapider than the controlling signal for ballasting charging modulating the output voltage. The loading circuit 23 receives the reached predetermined value of the output voltage according to the modulation of the modulation circuit.

Furthermore, in an embodiment, the power management device 2 further comprises a voltage stabilizing circuit 24, which is used to suppress the amplitude of the ripple generated by the output voltage $V_{out}$ to stabilize the loading current $I_{Load}$ across on the loading circuit 23. Therefore, the voltage stabilizing circuit 24 avoids generating the ripple across on the output voltage $V_{out}$. The voltage stabilizing circuit 24 comprises an external capacitor $C_{ext}$, which stores the output voltage $V_{out}$.

In an embodiment, the boost circuit 21 can be implemented to provide the output voltage $V_{out}$ by a variety of voltage converting circuits such as a voltage regulator or a charge pump. The charge pump comprises a Dickson charge pump, etc.

In an embodiment, the loading circuit 23 comprises a driving signal generating circuit adaptable to a touch panel (not shown) for providing a driving signal to the touch panel. The driving signal is induced by the touch panel to generate an induced signal, which is then processed by a signal processing technique to determine whether the touch panel is touched and to decide a touch point if touched.

In an embodiment, the modulation circuit modulates the output voltage $V_{out}$ by the controlling signal for ballasting charging and the controlling signal for boosting charging. That is, there are mathematical relations between the controlling signal for ballasting charging, the controlling signal for boosting charging and the output voltage. The details will describe below.

In an embodiment, the detection circuit 22 comprises a comparator for comparing the output voltage $V_{out}$ across on the voltage stabilizing circuit 24 with a predetermined value $V_{ref}$. The predetermined value $V_{ref}$ comprises a reference voltage of the touchable control system, which is generated by a band gap circuit or a predetermined clock CK of the touchable control system.

Furthermore, in another embodiment, the device for detecting the variable current also can be implemented in the detection circuit 22 of the present invention. That is, if the output current $I_O$ generated by the boost circuit 21 reaches the predetermined current value, the loading circuit 23 will receive the reached predetermined value of the output voltage $V_{out}$.

The power management device 2 further comprises a change-over switch SW, which electrically connects between the loading circuit 23 and the output terminal 21t of the boost circuit 21. While the output voltage $V_{out}$ detected by the detection circuit 22 reaches the predetermined value $V_{ref}$, the change-over switch SW electrically connects to the loading circuit 23 and the output terminal 21t of the boost circuit 21 such that the loading circuit 23 receives the output voltage $V_{out}$. While the output voltage $V_{out}$ detected by the detection circuit 22 has not reach the predetermined value $V_{ref}$ yet, the change-over switch SW electrically disconnects the loading circuit 23 with the output terminal 21t of the boost circuit 21. Therefore, the power management device 2 avoids the consumption of the output current $I_O$ since the change-over switch SW electrically connects to the loading circuit 23 and the output terminal 21t of the boost circuit 21. That is, the power management device 2 avoids the consumption of the loading current $I_{Load}$.

Furthermore, while the change-over switch SW electrically disconnects the loading circuit 23 with the output terminal 21t of the boost circuit 21, the output current $I_O$ fully flows to the voltage stabilizing circuit 24. Therefore, the output voltage $V_{out}$ across on the voltage stabilizing circuit 24 rapidly reaches the operating voltage $V_{DDH}$ of the loading circuit 23 such that the touchable control system rapidly restores the sleep mode to the operating mode while receiving the touch inputs.

Figure 2B:
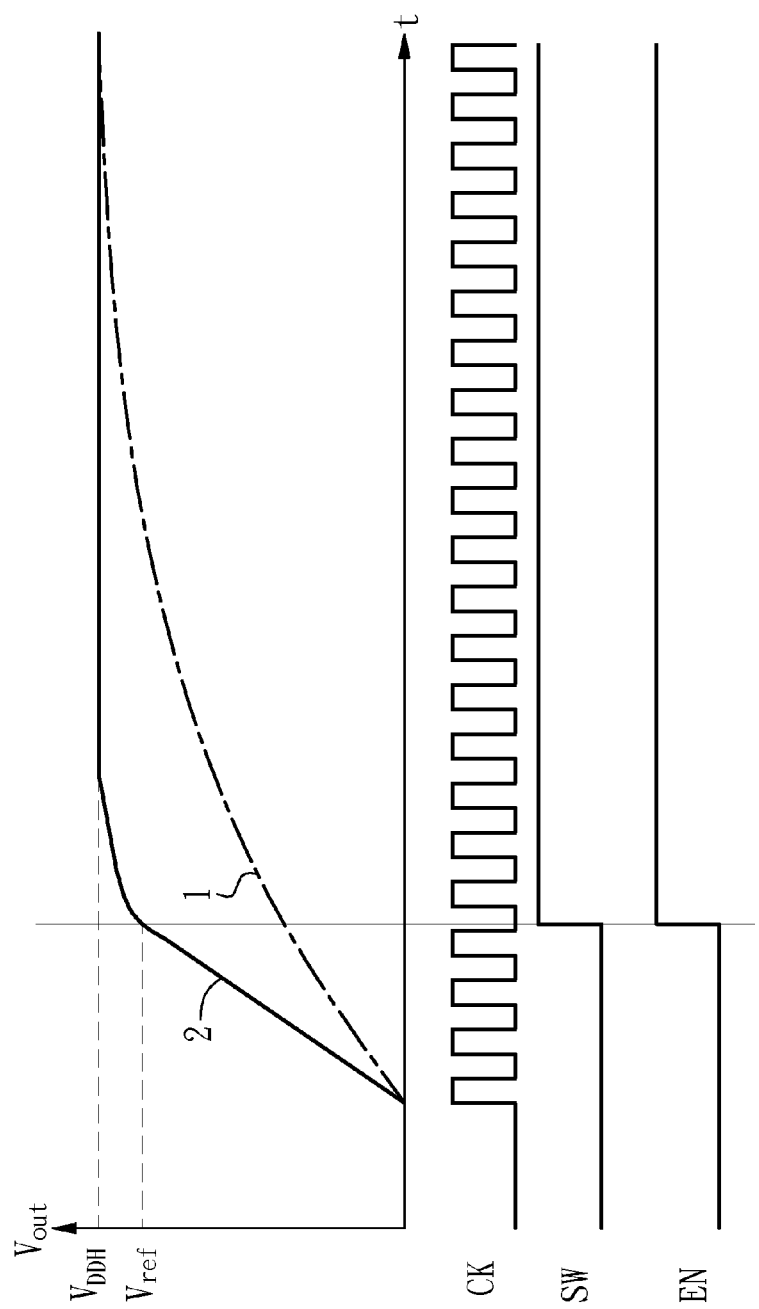
FIG. 2B shows one operating state of the power management device of the touchable control system of the present invention.

FIG. 2B shows one operating state of the power management device 2 of the touchable control system of the present invention. As mentioned above, the predetermined value $V_{ref}$ is generated according to the predetermined clock CK of the touchable control system. Therefore, while the clock of the touchable control system reaches the predetermined clock CK related to the predetermined value $V_{ref}$, the touchable control system will utilize an enable signal EN to enable the electrical connection of the loading circuit 23 and the boost circuit 21 by the change-over switch SW. The charging rate as the curve 2 shown, compared to the charging rate of the curve 1 of modulating the output voltage $V_{out}$ by a controlling signal for ballasting charging in the prior art, can more rapidly reach to the operating voltage $V_{DDH}$. The details will describe below.

Besides, it should be noted that the output voltage $V_{out}$ in the figures of the present invention charges from zero but which is simply clarified, not to limit the scope of the present invention. In other words, the power management device 2 of the touchable control system of the present invention includes the detection circuit 22, which is carried out detecting the output voltage $V_{out}$. When the touchable control system restores the sleep mode to the operating mode and restores the operating mode to the sleep mode, the output voltage $V_{out}$ across the voltage stabilizing circuit 24 is not significantly decreased. That is, the output current $I_O$ fully flows to the voltage stabilizing circuit 24 by disconnecting the boost circuit 21 and the loading circuit 23 with the change-over switch SW so as to the touchable control system can rapidly restore the sleep mode to the operating mode with controlling signal for boosting charging while receiving the touch inputs next time.

The boost circuit 21 comprises a plurality of transistors 211, 212, 213, 214, wherein the transistor 214 electrically connects to the voltage stabilizing circuit 24. In another embodiment of the present invention, the predetermined value $V_{ref}$ can be set between a breakdown voltage $V_{breakdown}$ of the transistor 214 electrically connecting to the voltage stabilizing circuit 24 and the operating voltage $V_{DDH}$ of the touchable control system.

Moreover, the boost circuit 21 of the embedment may be implemented by a variety of voltage converting circuits. FIG. 2A shows a four-stage Dickson charge pump that may be adapted to implement the boost circuit 21 and may be described as follows:

$$V_{out} = V_{DD} + \Delta V - \sum_{k=1}^{4} V_{th} * V_k$$

$$\Delta V = V_{DD}[C/(C+Cs)] - Io/[f*(C+Cs)]$$

where $V_k$ is a node voltage of each stage circuit (k from 1 to 4), $\Delta V$ is a voltage difference of each stage circuit, $V_{DD}$ is a logic high-level voltage (or the low voltage) of a pulse/inverted-pulse signal CK/CKB, f is a frequency of the pulse/inverted-pulse signal CK/CKB, $V_{th}$ is a threshold voltage of a transistor, C is capacitance of each stage circuit, Cs is parasitic capacitance at each node, $I_O$ is an output current that is split into a current $I_C$ flowing through the voltage stabilizing circuit 24 and a load current $I_{Load}$.

As mentioned above, while the output voltage $V_{out}$ detected by the detection circuit 22 has not reach the predetermined value $V_{ref}$ yet, the power management device 2 modulates the output voltage $V_{out}$ with the controlling signal for boosting charging instead of the controlling signal for ballasting charging, wherein the controlling signal for boosting charging modulating the output voltage is more rapider than the controlling signal for ballasting charging modulating the output voltage. Furthermore, according to the mathematical relations mentioned above, while the frequency increases, the $\Delta V$ increases and the output voltage $V_{out}$ increases more rapidly. Therefore, after the output voltage $V_{out}$ reaches the predetermined value $V_{ref}$, the modulation circuit modulates the output voltage $V_{out}$ by the controlling signal for ballasting charging instead of the controlling signal for boosting charging. Similarity, while the frequency decreases, the $\Delta V$ decreases and the output voltage $V_{out}$ increases steady.

Figure 3A:
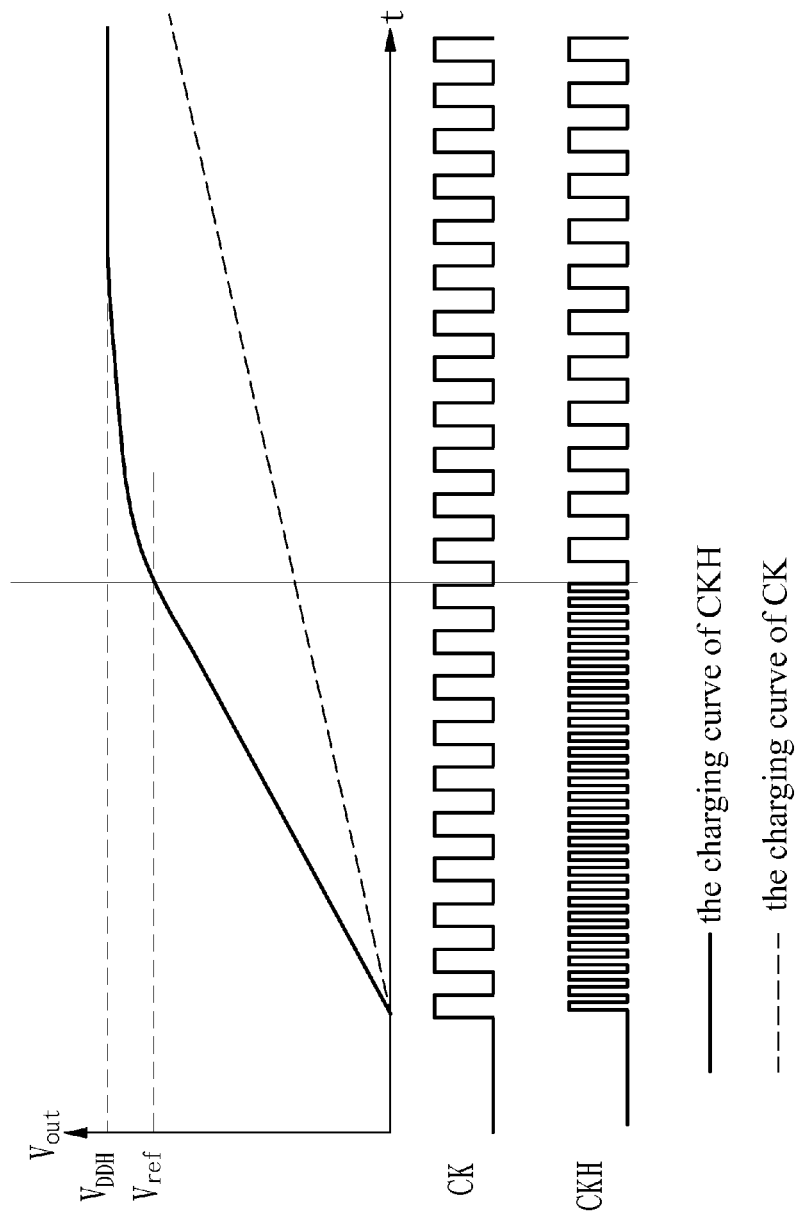
FIG. 3A shows one embodiment of the power management device of the touchable control system of the present invention, which utilizes the modulation circuit to modulate the output voltage.

FIG. 3A shows one embodiment of the power management device 2 of the touchable control system of the present invention, which utilizes the modulation circuit to modulate the output voltage $V_{out}$. According to FIG. 3A, before the output voltage $V_{out}$ reaches the predetermined value $V_{ref}$, the power management device 2 modulates the output voltage $V_{out}$ by the controlling signal for boosting charging (CKH). After the output voltage $V_{out}$ reaches the predetermined value $V_{ref}$, the power management device 2 modulates the output voltage $V_{out}$ by the controlling signal for ballasting charging (CK). Furthermore, while the frequency of the controlling signal for boosting charging (CKH) increases, the charging curve of CKH compared to the charging curve of CK which boosts the output voltage $V_{out}$ with the frequency of the controlling signal for ballasting charging, the output voltage $V_{out}$ increases more rapidly.

In another embodiment of the present invention, the controlling signal for boosting charging is generated according to the combination of the controlling signal for ballasting charging and a controlling signal for inserting pulse, wherein the frequency of the controlling signal for inserting pulse is higher than the frequency of controlling signal for ballasting charging. Furthermore, the modulation circuit utilizes an OR gate (not shown) to implement the combination of the controlling signal for ballasting charging and the controlling signal for inserting pulse. While the output voltage $V_{out}$ has not reach the predetermined value $V_{ref}$ yet, the power management device 2 inputs the controlling signal for ballasting charging (CK) and the controlling signal for inserting pulse to the OR gate to generate the controlling signal for boosting charging. While the output voltage $V_{out}$ has reached the predetermined value $V_{ref}$, the power management device 2 inputs no controlling signal for inserting pulse to the OR gate such that the OR gate outputs the controlling signal for ballasting charging (CK). Similarity, the variable output voltage $V_{out}$ modulated by the controlling signal for boosting charging (CKH) and the controlling signal for ballasting charging (CK) is the same as the mathematical relations mentioned above and the details will not repeat again.

Figure 3B:
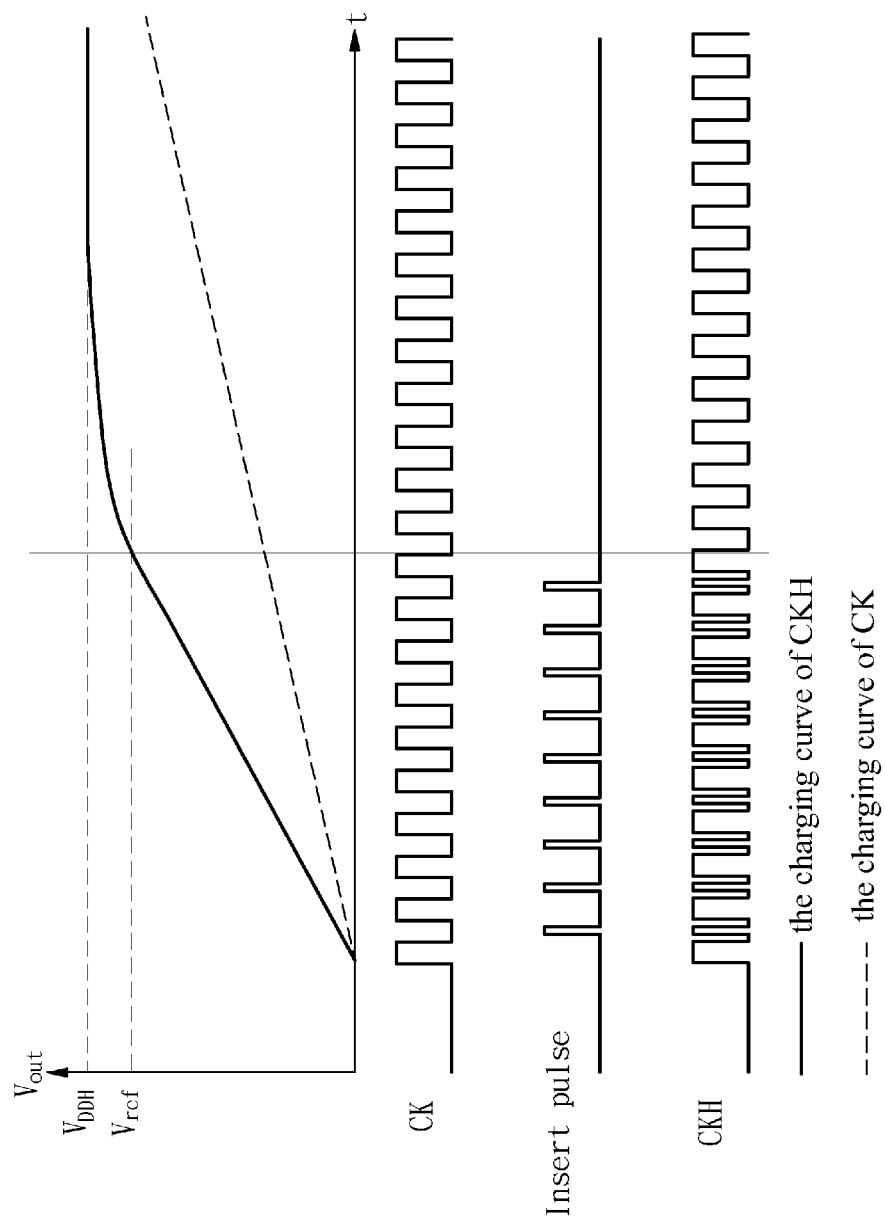
FIG. 3B shows another embodiment of the power management device of the touchable control system of the present invention, which utilizes the modulation circuit to modulate the output voltage.

FIG. 3B shows another embodiment of the power management device 2 of the touchable control system of the present invention, which utilizes the modulation circuit to modulate the output voltage $V_{out}$. The frequency of the controlling signal for inserting pulse is higher the frequency of the controlling signal for ballasting charging. After the controlling signal for inserting pulse and the controlling signal for ballasting charging input to the OR gate, the power management device 2 generates the frequency of the controlling signal for boosting charging higher than the controlling signal for ballasting charging. Besides, implementing the combination of the controlling signal for inserting pulse and the controlling signal for ballasting charging by the OR gate is one embodiment of the present invention. Similar circuit also can be implemented to combine the controlling signal for inserting pulse and the controlling signal for ballasting charging in another embodiment of the present invention. Similarity, while the frequency of the controlling signal for boosting charging increases, which charging rate (CKH) boosting the output voltage $V_{out}$ compared to charging rate (CK) of the frequency of the controlling signal for ballasting charging is more rapider.

Figure 4A:
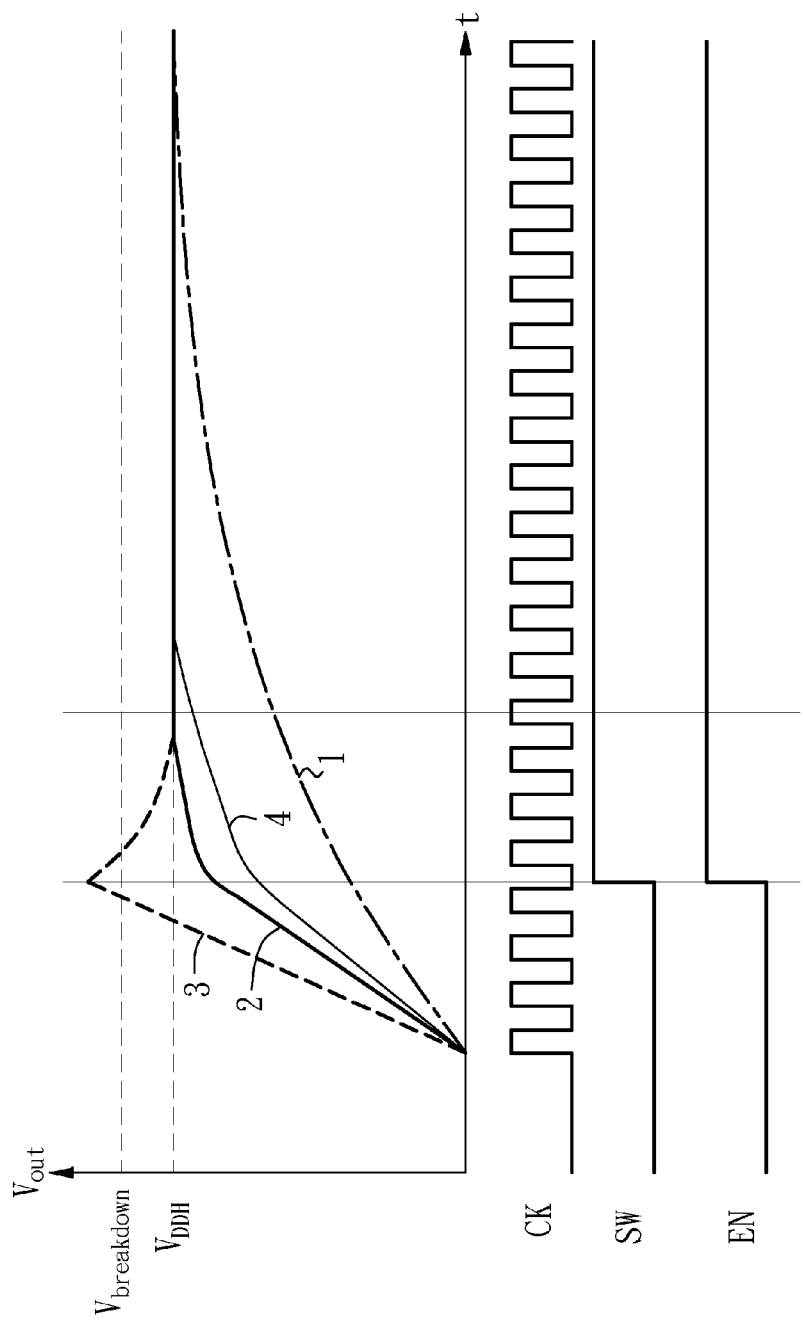
FIG. 4A shows another operating state of the power management device of the touchable control system of the present invention.

FIG. 4A shows another embodiment of the operating state of the power management device 2 of the touchable control system of the present invention. As mentioned above, every capacitor C, parasitic capacitance Cs and threshold voltage $V_{th}$ of a transistor in the integrated circuit are not all the same due to the tolerance of the fabrication and the temperature such that the slope of the output voltage $V_{out}$ arises differently. Therefore, enabling the change-over switch SW with a constant frequency may cause the voltage stabilizing circuit 24 to charge overly such that the output voltage $V_{out}$ across the voltage stabilizing circuit 24 exceeds the breakdown voltage of the transistor 214 and damages the transistor 214, as the curve 3 shown. Alternatively, enabling the change-over switch SW with a constant frequency may cause the long response of restoring the sleep mode to the operating mode, as the curve 4 shown.

Figure 4B:
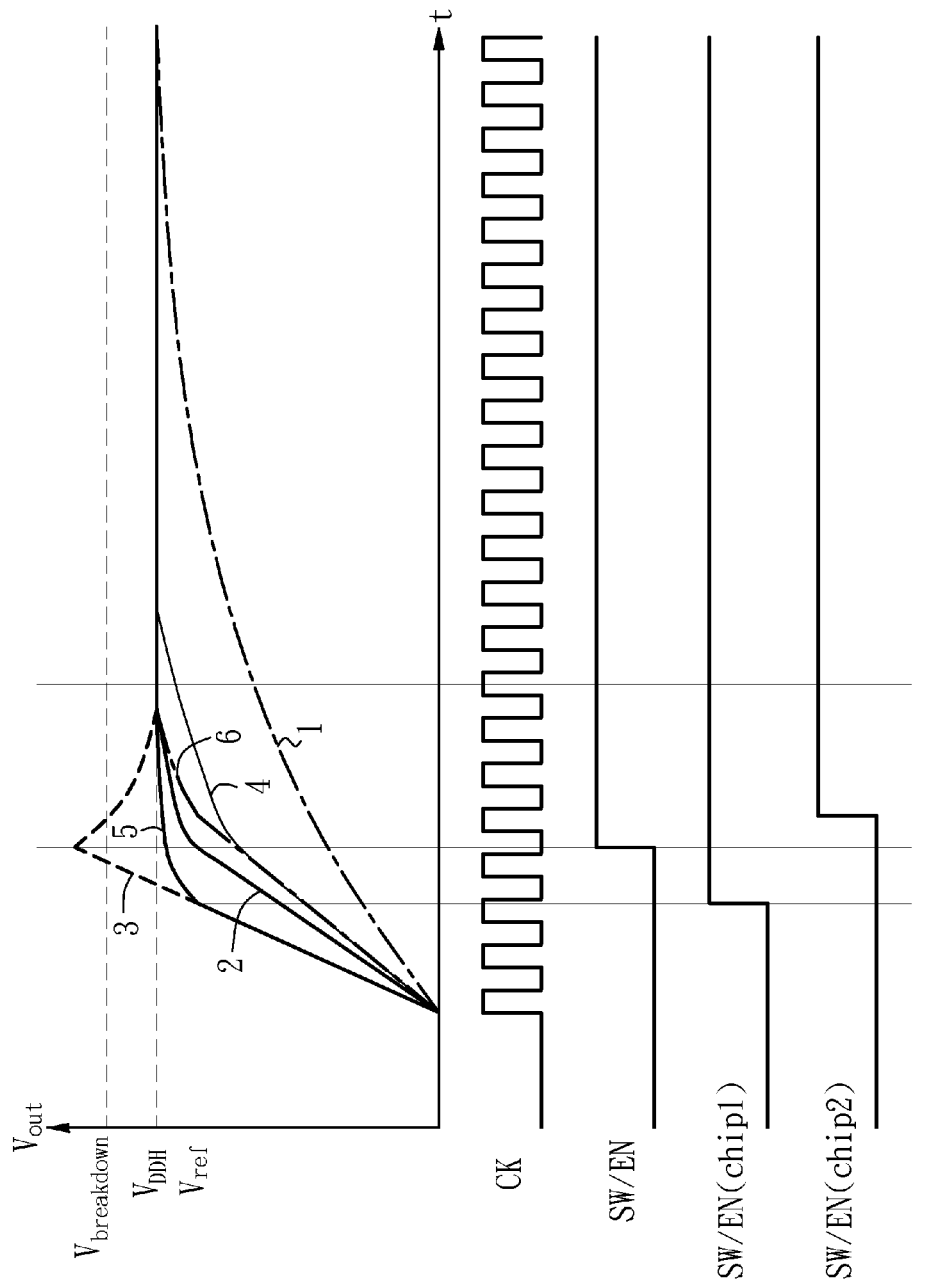
FIG. 4B shows another operating state of the power management device of the touchable control system of the present invention.

FIG. 4B shows another operating state of the power management device 2 of the touchable control system of the present invention. As mentioned above, the power management device 2 can set an appropriate predetermined value $V_{ref}$ to improve the above issues of damaging the transistor and the long response. As the curve 5 shown, when the output voltage $V_{out}$ generated by utilizing the chip 1 reaches the predetermined value $V_{ref}$, which can be detected by the detection circuit 22. Then, by enabling the change-over switch SW to electrically connect the loading circuit 23 and the output terminal 21*t* of the boost circuit 21, a part of the output current $I_O$ flows to the loading circuit 23 to avoid damaging the transistor of the boost circuit 21. Furthermore, the curve 5 compared to the curve 1 does not cause the issue of charging slowly. Similarity, as the curve 6 shown, when the output voltage $V_{out}$ generated by utilizing the chip 2 reaches the predetermined value $V_{ref}$, which can be detected by the detection circuit 22. Then, by enabling the change-over switch SW to electrically connect the loading circuit 23 and the output terminal 21*t* of the boost circuit 21, a part of the output current $I_O$ flows to the loading circuit 23 to avoid damaging the transistor of the boost circuit 21.

Figure 5:
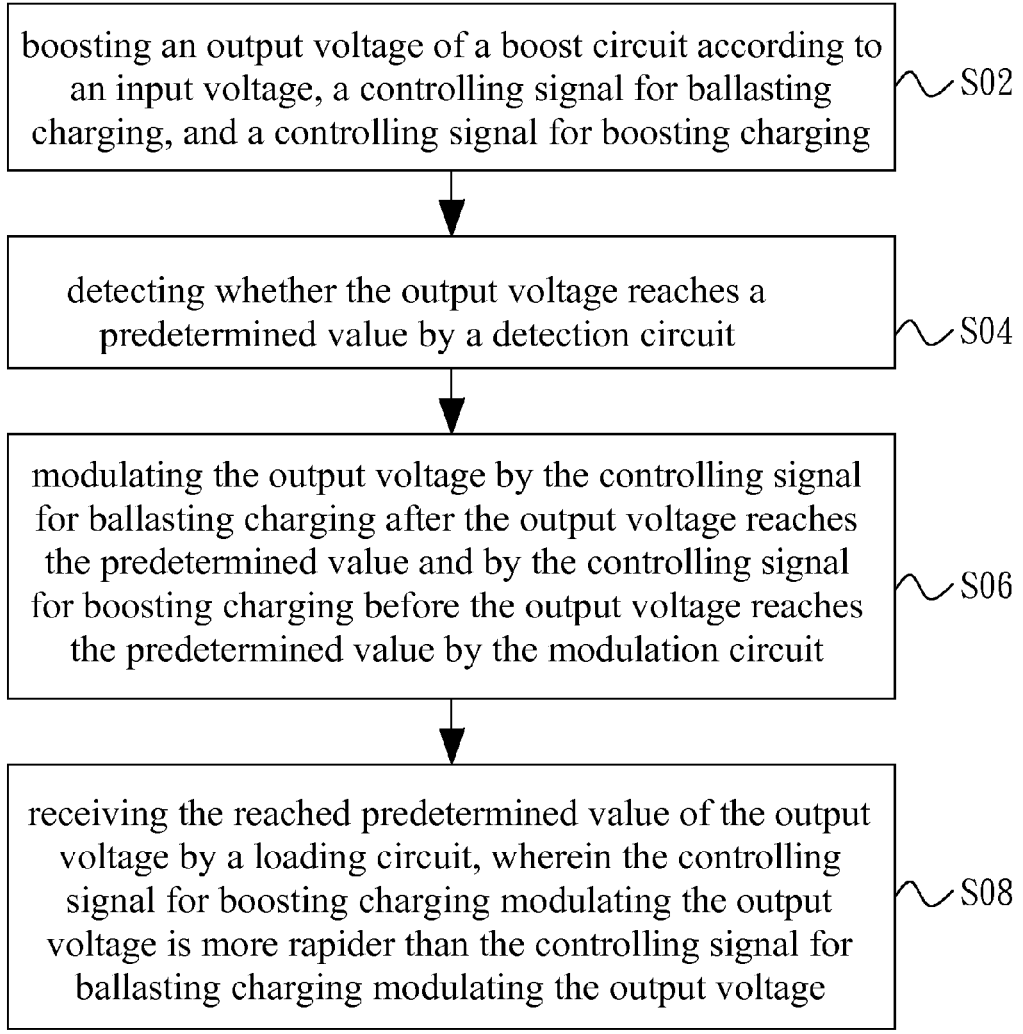
FIG. 5 shows the flow diagram of the power management method of the touchable control system of the present invention.

FIG. 5 shows the flow diagram of the power management method of the touchable control system of the present invention. The power management method of a touchable control system, comprises the following steps: In the step S02, boosting an output voltage of a boost circuit according to an input voltage, a controlling signal for ballasting charging, and a controlling signal for boosting charging; In the step S04, detecting whether the output voltage reaches a predetermined value by a detection circuit; In the step S06, modulating the output voltage by the controlling signal for ballasting charging after the output voltage reaches the predetermined value and by the controlling signal for boosting charging before the output voltage reaches the predetermined value by the modulation circuit, wherein the controlling signal for boosting charging modulating the output voltage is more rapider than the controlling signal for ballasting charging modulating the output voltage; In the step S08, receiving the reached predetermined value of the output voltage by a loading circuit.

As mentioned above, the power management method further comprises a step of suppressing the amplitude of the ripple generated by the output voltage by a voltage stabilizing circuit 24. In an embodiment of the present invention, the voltage stabilizing circuit 24 is an external capacitor $C_{ext}$. The power management method further comprises a step which electrically disconnects the boost circuit and the loading circuit by a change-over switch before the output voltage reaches the predetermined value. While the output voltage reaches the predetermined value $V_{ref}$, the change-over switch SW electrically connects the boost circuit 21 and the loading circuit 23 such that the output voltage $V_{out}$ transmits to the loading circuit 23.

In one embodiment of the present invention, the frequency of the controlling signal for boosting charging is higher than a frequency of controlling signal for ballasting charging. In another embodiment of the present invention, the controlling signal for boosting charging is generated according to the combination of the controlling signal for ballasting charging and a controlling signal for inserting pulse, wherein a frequency of the controlling signal for inserting pulse is higher than a frequency of controlling signal for ballasting charging.

As mentioned above, the controlling signal for ballasting charging and the controlling signal for inserting pulse are combined by an OR gate but not limit the scope of the present invention. Furthermore, the boost circuit 21 comprises a charge pump. The charge pump comprises a Dickson charge pump. Similar principles are the same as the power management mentioned above and the details will not repeat again.

In summary, before the output voltage reaches the predetermined value, that is the operating voltage which the loading circuit can operate, the power management device and the power management method of the touchable control system of the present invention modulate the output voltage generated by the boost circuit by the controlling signal for boosting charging higher than the controlling signal for ballasting charging. Therefore, the output voltage more rapidly reaches the predetermined value so as to it can significantly decrease the response time of restoring the sleep mode to the operating mode by the touchable control system of the present invention such that the users can use such a mobile phone, a computer or an electronic system having a touchable screen of an electronic system more conveniently and rapidly. Besides, after the output voltage reaches the predetermined value, the power management device modulates the output voltage generated by the boost circuit by the controlling signal for ballasting charging so as to the output voltage steady rises. Therefore, the power management device avoids consuming the power and damaging the transistor and effectively manages the power of the touchable control system.

Although specific embodiments have been illustrated and described, it will be appreciated by those skilled in the art that various modifications may be made without departing from the scope of the present invention, which is intended to be limited solely by the appended claims.

What is claimed is:

1. A power management device of a touchable control system, comprising:
    a boost circuit boosting an output voltage according to an input voltage, a controlling signal for ballasting charging, and a controlling signal for boosting charging;
    a detection circuit detecting a predetermined value of the output voltage;
    a modulation circuit separately modulating the output voltage by the controlling signal for ballasting charging after the output voltage reaches the predetermined value and by the controlling signal for boosting charging before the output voltage reaches the predetermined value according to the detecting of the detection circuit;
    a loading circuit receiving the reached predetermined value of the output voltage according to the modulation of the modulation circuit; and
    a change-over switch electrically disconnecting the boost circuit and the loading circuit before the output voltage reaches the predetermined value;
    wherein the controlling signal for boosting charging modulating the output voltage is more rapider than the controlling signal for ballasting charging modulating the output voltage.

2. The power management device of claim 1, further comprising a voltage stabilizing circuit used to suppress the amplitude of the ripple generated by the output voltage.

3. The power management device of claim 2, wherein the voltage stabilizing circuit comprises an external capacitor.

4. The power management device of claim 1, wherein while the output voltage reaches the predetermined value, the change-over switch electrically connects the boost circuit and the loading circuit such that the output voltage of the boost circuit transmits to the loading circuit.

5. The power management device of claim 1, wherein a frequency of the controlling signal for boosting charging is higher than a frequency of controlling signal for ballasting charging.

6. The power management device of claim 1, wherein the controlling signal for boosting charging is generated according to the combination of the controlling signal for ballasting charging and a controlling signal for inserting pulse, wherein a frequency of the controlling signal for inserting pulse is higher than a frequency of controlling signal for ballasting charging.

7. The power management device of claim 6, wherein the controlling signal for ballasting charging and the controlling signal for inserting pulse are combined by an OR gate.

8. The power management device of claim 1, wherein the boost circuit comprises a charge pump.

9. The power management device of claim 8, wherein the charge pump comprises a Dickson charge pump.

10. The power management device of claim 1, wherein the detection circuit comprises a comparator.

11. The power management device of claim 1, wherein the loading circuit comprises a driving signal generating circuit.

12. The power management device of claim 1, wherein the touchable control system comprises a mobile phone, a computer or an electronic system having a touchable screen.

13. The power management device of claim 12, wherein the predetermined value of the output voltage comprises a reference voltage of the touchable control system.

14. The power management device of claim 12, wherein the predetermined value of the output voltage is generated according to a predetermined clock of the touchable control system.

15. The power management device of claim 3, wherein the boost circuit comprises a plurality of transistors and one of which electrically connects to the external capacitor.

16. The power management device of claim 15, wherein the predetermined value of the output voltage is between a breakdown voltage of the transistor electrically connecting to the external capacitor and an operating voltage of the touchable control system.

17. A power management method of a touchable control system, comprising the following steps:
boosting an output voltage of a boost circuit according to an input voltage, a controlling signal for ballasting charging, and a controlling signal for boosting charging;
detecting whether the output voltage reaches a predetermined value by a detection circuit;
modulating the output voltage by the controlling signal for ballasting charging after the output voltage reaches the predetermined value and by the controlling signal for boosting charging before the output voltage reaches the predetermined value by the modulation circuit, wherein the controlling signal for boosting charging modulating the output voltage is more rapider than the controlling signal for ballasting charging modulating the output voltage;
receiving the reached predetermined value of the output voltage by a loading circuit; and
electrically disconnecting the boost circuit and the loading circuit by a change-over switch before the output voltage reaches the predetermined value.

18. The power management method of claim 17, further comprising a step of suppressing the amplitude of the ripple generated by the output voltage by a voltage stabilizing circuit.

19. The power management method of claim 18, wherein the voltage stabilizing circuit is an external capacitor.

20. The power management method of claim 17, wherein while the output voltage reaches the predetermined value, the change-over switch electrically connects the boost circuit and the loading circuit such that the output voltage of the boost circuit transmits to the loading circuit.

21. The power management method of claim 17, wherein a frequency of the controlling signal for boosting charging is higher than a frequency of controlling signal for ballasting charging.

22. The power management method of claim 17, wherein the controlling signal for boosting charging is generated according to the combination of the controlling signal for ballasting charging and a controlling signal for inserting pulse, wherein a frequency of the controlling signal for inserting pulse is higher than a frequency of controlling signal for ballasting charging.

23. The power management method of claim 22, wherein the controlling signal for ballasting charging and the controlling signal for inserting pulse are combined by an OR gate.

24. The power management method of claim 17, wherein the boost circuit comprises a charge pump.

25. The power management method of claim 24, wherein the charge pump comprises a Dickson charge pump.

* * * * *